(12) United States Patent
Song et al.

(10) Patent No.: US 10,707,236 B2
(45) Date of Patent: Jul. 7, 2020

(54) ARRAY SUBSTRATE, MANUFACTURING METHOD THEREFOR AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN); Fengjuan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/061,078

(22) PCT Filed: Oct. 26, 2017

(86) PCT No.: PCT/CN2017/107890
§ 371 (c)(1),
(2) Date: Jun. 11, 2018

(87) PCT Pub. No.: WO2018/149171
PCT Pub. Date: Aug. 23, 2018

(65) Prior Publication Data
US 2019/0280018 A1 Sep. 12, 2019

(30) Foreign Application Priority Data
Feb. 17, 2017 (CN) .......................... 2017 1 0087170

(51) Int. Cl.
*H01L 29/04* (2006.01)
*H01L 27/12* (2006.01)
(Continued)

(52) U.S. Cl.
CPC .......... *H01L 27/1225* (2013.01); *H01L 21/77* (2013.01); *H01L 27/1214* (2013.01);
(Continued)

(58) Field of Classification Search
CPC ................. H01L 27/12; H01L 27/1255; H01L 29/78633
See application file for complete search history.

(56) References Cited

U.S. PATENT DOCUMENTS 6,197,623 B1 * 3/2001 Joo ...................... H01L 21/2026
438/151
2014/0175445 A1 6/2014 Cai et al.
(Continued)

FOREIGN PATENT DOCUMENTS

| CN | 103904086 A | 7/2014 |
|---|---|---|
| CN | 105655410 A | 6/2016 |
| CN | 106876327 A | 6/2017 |

OTHER PUBLICATIONS

International Search Report dated Feb. 5, 2018.

*Primary Examiner* — Phuc T Dang
(74) *Attorney, Agent, or Firm* — Dilworth & Barrese, LLP.; Michael J. Musella, Esq.

(57) ABSTRACT

An array substrate, a manufacturing method thereof and a display device are provided. The manufacturing method includes: forming a light-shielding pattern layer, a buffer layer, an active layer, a gate insulating layer and a gate electrode on a base substrate, which are away from the base substrate in sequence; depositing an amorphous silicon (a-Si) film on the base substrate in a temperature range of 15-150° C.; forming a first interlayer dielectric (ILD) at least disposed above the active layer by patterning the a-Si film; forming through holes in the first ILD, through which a source contact region and a drain contact region of the active layer are exposed; and forming a source electrode and a drain electrode on the first ILD, which are respectively connected with the source contact region and the drain contact region via the through holes.

18 Claims, 4 Drawing Sheets

(51) Int. Cl.
*H01L 29/786* (2006.01)
*H01L 27/32* (2006.01)
*H01L 21/77* (2017.01)
*G02F 1/1362* (2006.01)

(52) U.S. Cl.
CPC ...... *H01L 27/1259* (2013.01); *H01L 27/1288* (2013.01); *H01L 27/3234* (2013.01); *H01L 27/3274* (2013.01); *H01L 29/78633* (2013.01); *G02F 1/136209* (2013.01); *G02F 2001/136222* (2013.01); *H01L 27/3244* (2013.01)

(56) References Cited

U.S. PATENT DOCUMENTS

2017/0117304 A1\* 4/2017 Kim .................... H01L 27/1251
2018/0033728 A1\* 2/2018 Zhang ............... H01L 21/76804

\* cited by examiner

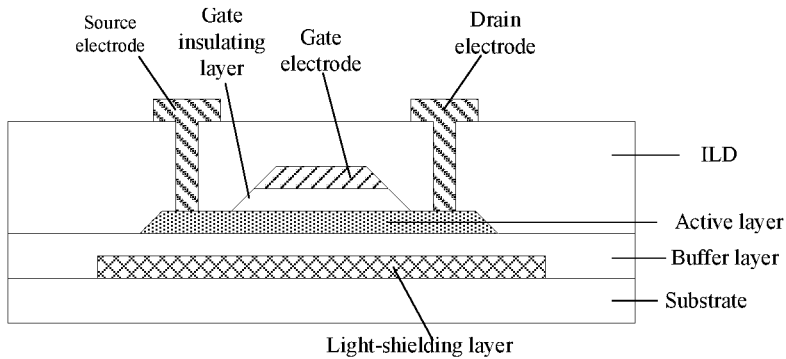

FIG. 1

```
┌─────────────────────────────────────────────────────────────────────────────────┐
│ Forming a light-shielding pattern layer, a buffer layer, an active layer, a gate insulating layer and a gate electrode on a │
│ base substrate, which are away from the base substrate in sequence,             │
└─────────────────────────────────────────────────────────────────────────────────┘  ～S01
                                        │
                                        ▼
┌─────────────────────────────────────────────────────────────────────────────────┐
│ Depositing an a-Si film above the base substrate by using Si as a target material via a sputtering process in a vacuum or │
│ an insert gas environment, in which the depositing temperature of the a-Si film is 15-150°C; or depositing an a-Si film │
│ above the base substrate by using Si as an evaporation source via a vapor depositing process in a vacuum or an inert │
│ gas environment, in which the depositing temperature of the a-Si film is 15-150°C │
└─────────────────────────────────────────────────────────────────────────────────┘  ～S02
                                        │
                                        ▼
┌─────────────────────────────────────────────────────────────────────────────────┐
│ Forming a first ILD at least disposed above the active layer by performing a patterning process on the formed a-Si film │
│ , in which through holes are formed in the first ILD, through which a source contact region and a drain contact region │
│ on the active layer are exposed,                                                │
└─────────────────────────────────────────────────────────────────────────────────┘  ～S03
                                        │
                                        ▼
┌─────────────────────────────────────────────────────────────────────────────────┐
│ Forming a source electrode and a drain electrode on the first ILD, which are respectively connected with the source │
│ contact region and the drain contact region via the through holes.              │
└─────────────────────────────────────────────────────────────────────────────────┘  ～S04
```

FIG. 2

ARRAY SUBSTRATE, MANUFACTURING METHOD THEREFOR AND DISPLAY DEVICE

CROSS REFERENCE TO RELATED APPLICATIONS

The application claims priority to the Chinese patent application No. 201710087170.1 filed on Feb. 17, 2017 in SIPO and entitled "Array Substrate, Manufacturing Method thereof and Display Device", which is incorporated herein by reference in its entirety.

TECHNICAL FIELD

Embodiments of the present disclosure relate to an array substrate, a manufacturing method therefor and a display device.

BACKGROUND

Top-gate (TPG) thin-film transistors (TFTs) are widely applied in array substrates of active-matrix display products for small overlap area between gate electrodes and source/drain electrodes and relatively small parasitic capacitance.

SUMMARY

Embodiments of the present disclosure provide an array substrate, a manufacturing method therefor and a display device, which can effectively avoid the active layer from being affected by illumination, and reduce the Vth drift phenomenon, allowing good switching performances of the device.

At least one embodiment of the present disclosure provides a method for manufacturing an array substrate, comprising: forming a light-shielding pattern layer, a buffer layer, an active layer, a gate insulating layer and a gate electrode on a base substrate, which are away from the base substrate in sequence; forming an amorphous silicon (a-Si) film on the base substrate in a temperature range of 15-150° C.; forming a first interlayer dielectric (ILD) at least disposed above the active layer by patterning the a-Si film; forming through holes in the first ILD, through which a source contact region and a drain contact region of the active layer are exposed; and forming a source electrode and a drain electrode on the first ILD, which are respectively connected with the source contact region and the drain contact region via the through holes.

For example, the a-Si film is deposited and formed on the base substrate by using silicon (Si) as a target material via a sputtering process in a vacuum or an inert gas environment; or the a-Si film is deposited and formed on the base substrate by using Si as an evaporation source via a vapor depositing process in a vacuum or an inert gas environment.

For example, before forming the first ILD by patterning the a-Si film, forming an insulating material film covering the a-Si film; and forming a first ILD and a second ILD with a same pattern, which are at least disposed above the active layer, by patterning the a-Si film and the insulating material film through a same patterning process, in which the through holes, through which the source contact region and the drain contact region of the active layer are exposed, run through the first ILD and the second ILD.

For example, the array substrate includes a plurality of pixel regions; and the manufacturing method further comprises: forming a hollowed-out part in each of the pixel regions, in the first ILD while forming the through holes in the first ILD, through which the source contact region and the drain contact region on the active layer are exposed.

For example, forming the source electrode and the drain electrode on the ILD(s) and respectively connected with the source contact region and the drain contact region via the through holes; forming a passivation layer covering the base substrate; and forming a color filter (CF) layer on a part of the passivation layer covering the hollowed-out regions.

For example, material of the gate electrode includes copper (Cu); and the first ILD directly contacts the gate electrode and the active layer.

For example, the active layer is an oxide semiconductor active layer, and both the source contact region and the drain contact region of the active layer are conductive regions formed by a doping process; and the first ILD directly contacts the gate electrode and the active layer.

For example, the first ILD contacts side surfaces of the active layer.

At least one embodiment of the present disclosure provides an array substrate, comprising: a base substrate; a light-shielding pattern layer, a buffer layer, an active layer, a gate insulating layer, and a gate electrode, which are away from the base substrate in sequence; a first interlayer dielectric (ILD) disposed above the active layer, the first ILD being made from opaque insulating a-Si material and provided with through holes through which a source contact region and a drain contact region of the active layer are exposed; and a source electrode and a drain electrode on the first ILD, which are respectively connected with the source contact region and the drain contact region via the through holes.

For example, the array substrate further comprises: a second ILD disposed on the first ILD and having a same pattern as that of the first ILD. The through holes, through which the source contact region and the drain contact region of the active layer are exposed, run through the first ILD and the second ILD.

For example, the array substrate further comprises: a plurality of pixel regions. The first ILD further includes a hollowed-out part disposed in each of the pixel regions.

For example, the array substrate further comprises: the source electrode and the drain electrode disposed on the ILD(s) and respectively connected with the source contact region and the drain contact region via the through holes; a passivation layer covering the base substrate; and a color filter layer disposed on parts of the passivation layer covering the hollowed-out regions.

For example, material of the gate electrode includes Cu; and the first ILD directly contacts the gate electrode and the active layer.

For example, the active layer is an oxide semiconductor layer, and both the source contact region and the drain contact region of the active layer are doped conductive areas; and the first ILD directly contacts the gate electrode and the active layer.

For example, the first ILD also contacts side surfaces of the active layer.

At least one embodiment of the present disclosure also provides a display device, comprising any of the array substrates.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which:

FIG. 1 is a schematically structural view of a top-gate type TFT in an array substrate;

FIG. 2 is a flow chart of a method for manufacturing an array substrate provided by an embodiment of the present disclosure;

DETAILED DESCRIPTION

Figure 3:
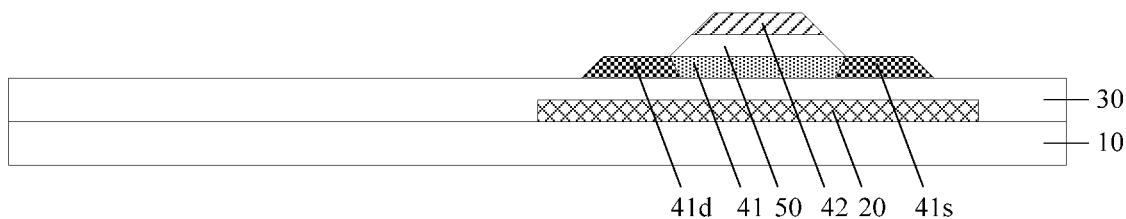
FIG. 3 is a schematic diagram 1 of structures formed by the method for manufacturing the array substrate provided by an embodiment of the present disclosure.

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not preclude other elements or objects. The terms, 'on,' 'under,' 'left,' 'right,' or the like are only used to indicate relative position relationship, and when the position of the object which is described is changed, the relative position relationship may be changed accordingly.

Due to actual sizes of the structures in the array substrate provided by the embodiments of the present disclosure may be very small, for clarity, the size of the structures and the thickness of the films or layers in the accompanying drawings of the embodiments of the present disclosure are enlarged, which do not represent the actual sizes or ratios.

The inventors noticed that: in a top-gate (TPG) type TFT, for instance, as shown in FIG. 1, as an active layer is disposed below a gate electrode, after light coming from one side of a base substrate away from the TFT runs through the base substrate and irradiates on the active layer, the negative bias illumination stability (NBIS) and the positive bias illumination stability (PBIS) of the active layer will be reduced, then the threshold voltage ($V_{th}$) of a device will be subjected to very serious drift. Therefore, for a TPG TFT, a shield layer and a buffer layer are sequentially deposited on the base substrate before the active layer is formed, and by utilization of the shield layer, the light from one side of the base substrate away from the TFT will not run through the base substrate and irradiates on the active layer, so the reliability of the device can be improved.

In the structure of the TPG TFT, to isolate a source-drain metal layer including a source electrode and a drain electrode and a gate metal layer including a gate electrode, an interlayer dielectric (ILD) is required to be deposited between the two layers. The conventional ILD materials include insulating mediums, such as silicon oxide ($SiO_x$), and silicon nitride ($SiN_x$).

These insulating materials are transparent, light emitted from an organic light-emitting diode (OLED) display element disposed on the TPG TFT or light of a backlight running through the buffer layer beneath the TFT will be subjected to a series of reflection and/or refraction in the layers of the array substrate, and finally there is light irradiating on the active layer of the TPG TFT as well. Thus, $V_{th}$ of the TFT will still be drifted, and the switching performances of the device can be affected.

As illustrated in FIG. 2, an embodiment of the present disclosure provides a method for manufacturing an array substrate, which comprises the following steps:

S01: as shown in FIG. 3, forming a light-shielding pattern layer 20, a buffer layer 30, a active layer 41, a gate insulating layer 50 and a gate electrode 42 on a base substrate 10, which are away from the base substrate 10 in sequence.

Figure 4:
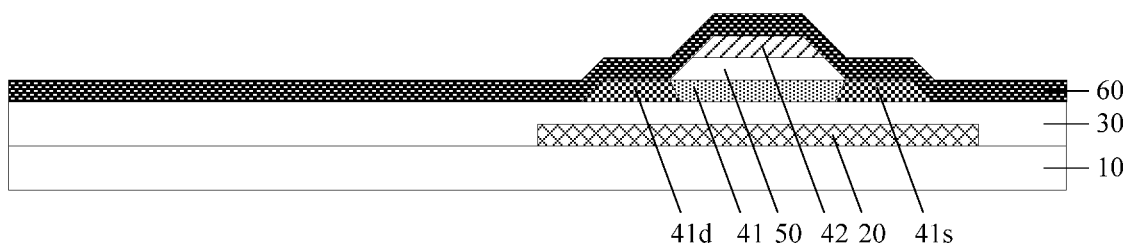
FIG. 4 is a schematic diagram 2 of structures formed by the method for manufacturing the array substrate provided by an embodiment of the present disclosure.

S02: as shown in FIG. 4, depositing an a-Si film 60 above the base substrate 10 by using Si as a target material via a sputtering process in a vacuum or insert gas environment, in which the deposition temperature of the a-Si film 60 is 15-150° C.; or depositing an a-Si film 60 above the base substrate 10 by using Si as an evaporation source via a vapor depositing process in a vacuum or an inert gas environment, in which the deposition temperature of the a-Si film 60 is 15-150° C.

Figure 6:
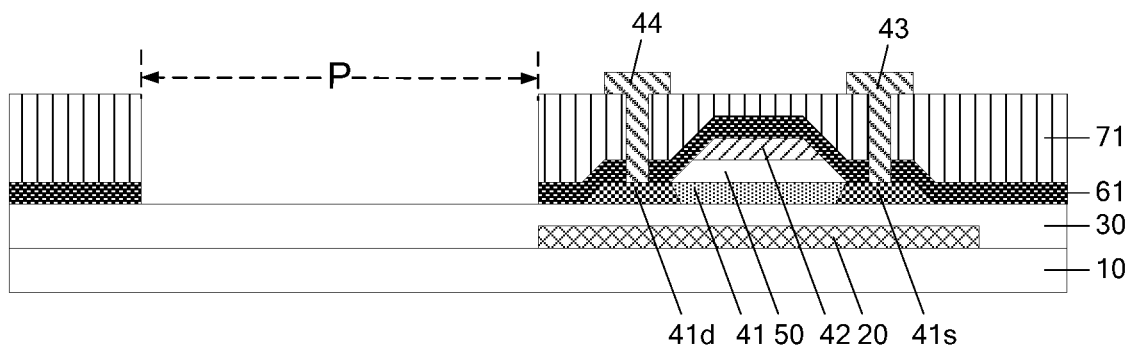
FIG. 6 is a schematic diagram 4 of structures formed by the method for manufacturing the array substrate provided by an embodiment of the present disclosure.

S03: as shown in FIG. 6, forming a first interlayer dielectric (ILD) 61 at least disposed above the active layer 41 by patterning the formed a-Si film 60, in which through holes 410, through which source contact region 41s and drain contact region 41d on the active layer 41 are exposed, are formed in the first ILD 61.

S04: as shown in FIG. 6, forming a source electrode 43 and a drain electrode 44, which are respectively connected with the source contact region 41s and the drain contact region 41d via the through holes 410, on the first ILD 61.

For the light-shielding pattern layer 20 and the buffer layer 30 in the step S01, for instance, the light-shielding pattern layer 20 may be disposed below the active layer 41, and a projection of the light-shielding pattern layer 20 on the base substrate 10 will completely cover a projection of the active layer 41 on the base substrate 10, so as to avoid light from one side of the base substrate 10 away from the TFT from running through the base substrate 10 and irradiating on the active layer 41.

Here, the light-shielding pattern layer 20, for instance, may be made from opaque Cu metal, chromic oxide or resin materials with black pigment(s), and the thickness of the light-shielding pattern layer may adopt the common thickness.

Buffer Layer 30

The buffer layer 30, covering the light-shielding pattern layer 20 in the form of whole layer, may adopt insulating materials commonly used in the array substrate. On one hand, the arrangement of the buffer layer 30 can provide a relatively flat base for the subsequently formed TFT, so as to facilitate the deposition of the film layers; in addition, as the film layers on the base substrate 10 often need certain high-temperature treatment in the process of deposition, and metal impurity ions in the base substrate 10 can be easily diffused in the high-temperature treatment process, the buffer layer 30 can function as an isolating layer for isolating the active layer 41 and the base substrate 10, so as to avoid the metal impurity ions in the base substrate 10 from being diffused into the active layer 41 and affecting the device performances of the TFT.

For instance, the "patterning process" in the patterning process of the step S03 refers to a process of forming a specific pattern by processing film layer(s) (one or more film layers). A typical patterning process is a process including photoresist exposure, development, etching and photoresist removal via a mask. The mask may be a common mask, a half-tone mask or a gray-tone mask, but the embodiment of the present disclosure is not limited thereto.

In the step S04, the step of forming electrode patterns, such as the source electrode 43, the drain electrode 44 and data lines connected with the source electrode 43, for instance, includes: depositing a metal layer on the base substrate 10, coating photoresist on the metal layer, forming photoresist-retained portions on the electrode patterns to be formed, such as the source electrode 43 and the drain electrode 44 after photoresist exposure and development processes, and removing the remaining photoresist by the development process. The parts of the metal layer exposed by photoresist are etched to form the electrode patterns, such as the source electrode 43 and the drain electrode 44, subsequently, the photoresist retained on the above electrode patterns is removed by an ashing process.

In addition, the method for manufacturing the array substrate further comprises the step of forming a pixel electrode (or an anode of an OLED device) connected with the drain electrode 44. The pixel electrode may be formed by a common process.

It should be noted that the a-Si film 60 formed in the step S02 in the embodiment of the present disclosure is made from opaque insulating material, which is essentially different from a-Si with semiconductor properties as the active layer material used in a-Si TFT active-matrix display. The mechanism is as follows.

The outmost electrons of Si atoms form conduction bands and valence bands through sp3 orbital hybridization, and the electrons in the valence bands may be transited to the conduction band energy level to participate in conduction excited by an external electric field, so that the Si materials can perform with semiconductor properties. The elemental Si has a variety of forms, e.g., monocrystalline silicon (mono-Si), polycrystalline (poly-Si) and amorphous silicon. The amorphous silicon (usually referred to as a-Si) is also referred to as amorphous silica. The electrical properties of a-Si are strongly correlated with the deposition condition of the a-Si film.

Due to the randomness of the a-Si lattice structure, the bond angles between the Si atoms are different, so there are a large number of band tail states and defect states in the Si atom energy band. The electrons are constantly subjected to the scattering of the band tail states and the trapping of the defect states during the transition to the conduction band, so it is difficult for the electrons to reach the conduction band. In this way, the resistance of the a-Si deposited at a relatively low temperature is very large and the obtained a-Si may be used as insulating material. In the manufacturing method provided by the embodiment of the present disclosure, the material of the a-Si film 60, formed by using Si as a target material via a sputtering process in a vacuum or an insert gas environment at the deposition temperature of 15-150° C. under the mechanism, has a variety of defects and very large resistance and is equivalent to a dense passivation and dielectric material, and the a-Si is opaque and has the function of protecting the active layer 41 from being affected by illumination. Similarly, the a-Si film 60, formed by using Si as an evaporation source via a vapor depositing process in a vacuum or an insert gas environment at the deposition temperature of 15-150° C., is also opaque insulating material.

Here, the depositing temperature in the step S02 is, for instance, the room temperature, so as to deposit the a-Si film with more defects, namely larger electric resistivity, at a low temperature. The foregoing "room temperature" is, for instance, 20° C.±5° C.

The a-Si used as the active layer of the TFT can only satisfy the performance requirement of the TFT device by having semiconductor property. When the a-Si is used as the material of the active layer of the TFT, the deposition of the a-Si film by the process, such as plasma enhanced chemical vapor deposition (PECVD), is required generally performed at a deposition temperature above 300° C., so as to reduce the defect and band tail state density in a-Si lattices. Meanwhile, in the deposition process, hydrogen (H) (the process is named hydrogenation) is doped into the a-Si to improve the electrical properties of the a-Si. The reason is that H atoms may be bonded with electrons not bonded in the Si atoms (that is to say, due to the disorder property of a-Si lattices, a large number of electrons, which are not bonded, in the Si atoms form "dangling bonds"), so as to further improve the order degree of the a-Si and improve the electron mobility of the a-Si. Currently, the a-Si used in the a-Si TFT active-matrix display product is hydrogenated a-Si, generally marked as a-Si:H.

The a-Si, which can be used as opaque insulating material, in the embodiment of the present disclosure, is essentially different from a-Si:H with semiconductor properties used as material of the active layer.

In the manufacturing method provided by the embodiment of the present disclosure, the opaque insulating a-Si material is prepared and used as the ILD 61 disposed above the active layer 41, which can protect the active layer 41 from being affected by illumination, reduce the $V_{th}$ drift phenomenon of the TFT, and allow good switching performances of the device. The preparation material of the first ILD 61 has a wide range of sources, and the manufacturing process is not complicated. Dense opaque a-Si with enough large electric resistivity, which may be used as insulating material, may be deposited and formed by a sputtering process in a vacuum or insert gas environment or by a vapor depositing process in a vacuum or an inert gas environment at a low temperature, which can simplify the process.

Figure 5:
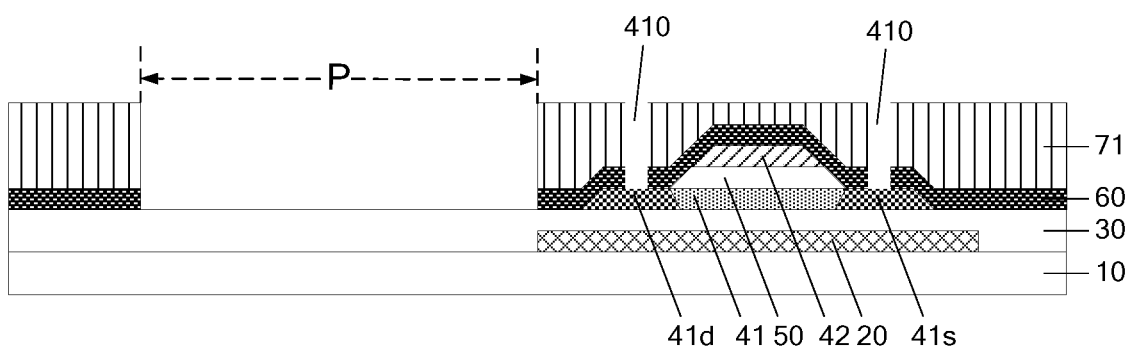
FIG. 5 is a schematic diagram 3 of structures formed by the method for manufacturing the array substrate provided by an embodiment of the present disclosure.

As shown in FIG. 5, the formed first ILD 61 is also disposed on the periphery of the active layer 41. That is to say, the first ILD 61 covers a region above the active layer and side surfaces of the active layer 41 relative to the base substrate 10.

In this way, the first ILD 61, formed by opaque insulating a-Si, and the light-shielding pattern layer 20 under the first ILD 61 are adopted to realize the basic encircling of the upper, lower, left and right of the active layer 41, so as to effectively avoid the reliability of the active layer 41 from being affected by illumination.

In order to reduce the parasitic resistance of the device, for instance, the material of the gate electrode 42 includes Cu, for instance, may be formed by Cu metal or an alloy containing Cu. The first ILD 61 formed by the a-Si material directly contacts the gate electrode 42 and the active layer 41, namely the first ILD 61 directly covers the gate electrode 42 and the active layer 41.

In this way, as the first ILD 61 is made from the opaque insulating a-Si material(s), and no oxygen element are introduced, the problem that Cu is oxidized due to the oxygen element, when insulating materials, such as silicon oxide and aluminum oxide, are adopted to form the ILD, can be avoided.

The active layer 41 formed in the step S01 is, for instance, made from an oxide semiconductor material having high mobility and good uniformity and being able to be prepared under low-temperature process, for example, the oxide semiconductor material may by indium gallium zinc oxide (IGZO). Both the source contact region 41s and the drain contact region 41d of the active layer 41 adopting the oxide semiconductor material(s) are conductive regions formed by a doping process. The formed first ILD 61 directly contacts the gate electrode 42 and the active layer 41.

In the step S01, for instance, the self-alignment process may be adopted to realize the patterning of the gate electrode 42 and the gate insulating layer 50, and conduction treatment may be performed on the active layer 41 made from the oxide semiconductor material to form the source contact region 41s and the drain contact region 41d which are doped. Subsequently, a back panel (BP, which is the shortened name of the array substrate by those skilled in the art) may be cleaned before the a-Si film 60 is deposited.

The step of utilizing the self-alignment process to realize the patterning of the gate electrode 42 and the gate insulating layer 50 and forming the source contact region 41s and drain contact region 41d which are doped by performing conduction treatment on the active layer 41 made from the oxide semiconductor material, for instance, includes: forming a pattern of the active layer 41 on the buffer layer 30 at first, sequentially and continuously depositing an insulating film of gate insulating layer material and a metal film of gate electrode material, performing a patterning process on the metal film of the gate electrode material, and forming a required pattern of the gate electrode 42; subsequently, removing the insulating film exposed by the pattern of the gate electrode 42 via a plasma etching process by adoption of the pattern of the gate electrode 42 as a metal mask, and forming a required pattern of the gate insulating layer 50. The process of forming the underlying gate insulating layer 50 having the same pattern as the gate electrode 42 by adoption of the formed pattern of the gate electrode 42 as the metal mask refers to the self-alignment process. The self-alignment process adopts the formed pattern as the mask, reduces the photolithography frequency, and improves the alignment preciseness of the patterns.

In the process of forming the gate insulating layer 50 with the required pattern by a plasma etching process, the regions on two sides (namely the source contact region 41s and the drain contact region 41d) of the pattern of the active layer 41 not covered by the gate electrode 42 are exposed, plasma will also be injected into the regions on the two sides, so that the source contact region 41s and the drain contact region 41d can be doped with plasma to form conductive regions.

The first ILD 61 of the a-Si material is formed above the active layer 41 of the oxide semiconductor material, Si atoms may be bound with oxygen on a surface of an oxide semiconductor to generate a variety of forms of $SiO_x$ with various stoichiometric proportions, so that the number of oxygen vacancies in the conductive regions (namely the source contact region 41s and the drain contact region 41d) in the active layer 41 can be increased, and the conduction effect of the source contact region 41s and the drain contact region 41d can be further enhanced, reducing the contact resistance obtained after the source electrode 43 and the drain electrode 44 are respectively connected with the source contact region 41s and the drain contact region 41d of the active layer 41, and the resistance of a lightly doped drain (LDD) area.

Figure 7:
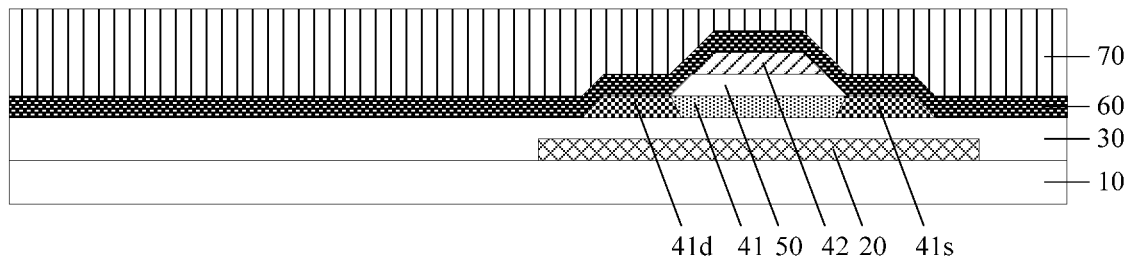
FIG. 7 is a schematic diagram 5 of structures formed by the method for manufacturing the array substrate provided by an embodiment of the present disclosure.

For instance, before the step S03, the manufacturing method further comprises a step: as shown in FIG. 7, forming an insulating material film 70 covering the a-Si film 60.

Correspondingly, as shown in FIG. 5, the step S03 includes: forming a first ILD 61 and a second ILD 71 with a same pattern, which are at least disposed above the active layer 41, by adoption of the same patterning process to process the a-Si film 60 and the insulating material film 70. Through holes 410, through which the source contact region 41s and the drain contact region 41d of the active layer 41 are exposed, run through the first ILD 61 and the second ILD 71.

It should be noted that: due to the small thickness of the a-Si film deposited by a sputtering process or a vapor depositing process, it is difficult to provide a flat base with a required thickness for the subsequent process; and due to slow film forming rate of the sputtering process or the vapor depositing process, it would take a long time to form a film with thicker thickness, so it is difficult for the industrial production. In addition, it is more important that: in a TPG type BP, when the thickness of the ILD between the source-drain metal layer including the source electrode 43 and the drain electrode 44 and the gate metal layer including the gate electrode 42 is smaller, the parasitic capacitance of the device is greater.

The above problem can be well solved by depositing a second interlayer insulating film with an appropriate thickness on the a-Si film 60 by adopting conventional insulating material for isolating the source-drain metal layer and the gate metal layer, in the embodiment of the present disclosure, for example.

The second ILD 71 may be, for instance, formed by depositing insulating material with an appropriate thickness via a PECVD process, and the insulating material includes silicon oxide, silicon nitride, silicon oxynitride and aluminum oxide.

As shown in FIG. 5, the array substrate is divided into a plurality of pixel regions (numeral P in the figure). When the array substrate is, for instance, applied in a liquid crystal display (LCD) device comprising a backlight or a bottom-emission/double-sided emission type organic light-emitting diode (OLED) display device, as the first ILD 61 is made from opaque insulating a-Si material, in order to allow the effective luminous efficiency of the array substrate, the first ILD 61 is provided with the through holes 410, through which the source contact region 41s and the drain contact region 41d on the active layer are exposed, and it is also provided with a hollowed-out part in each of the pixel regions P.

That is to say, when the through holes 410 are etched and formed, parts of the deposited a-Si film 60, covering the pixel regions P, are also etched and removed by a single patterning process, until the buffer layer 30 underlying is exposed.

Herein, when the array substrate is also provided with the second ILD 71 having the same pattern as the first ILD 61 and being made from the conventional insulating material(s), parts of the a-Si film 60 and the insulating material film 70, covering the pixel regions P, are also etched and removed at the same time when the through holes 410 running through the first ILD 61 and the second ILD 71 are formed, until the buffer layer 30 underlying is exposed.

Figure 8:
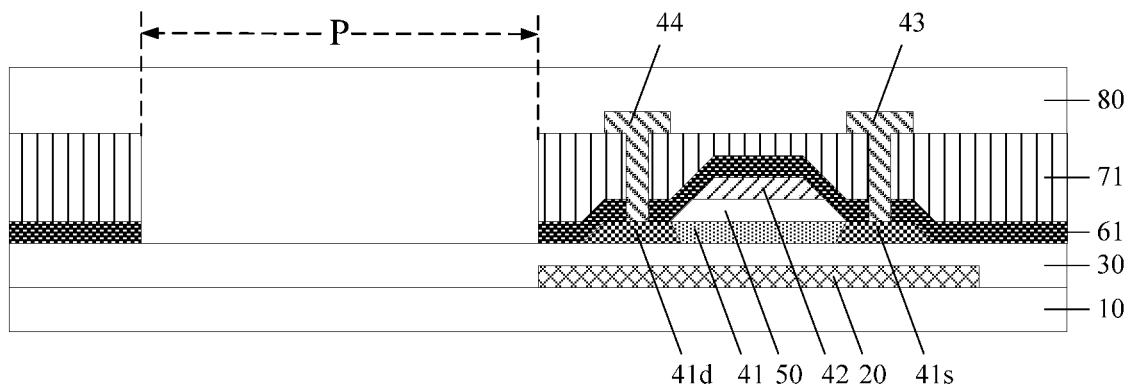
FIG. 8 is a schematic diagram 6 of structures formed by the method for manufacturing the array substrate provided by an embodiment of the present disclosure.

The manufacturing method further comprises the following steps:

S05: as shown in FIG. 8, forming a passivation layer 80 covering the base substrate 10.

Figure 9:
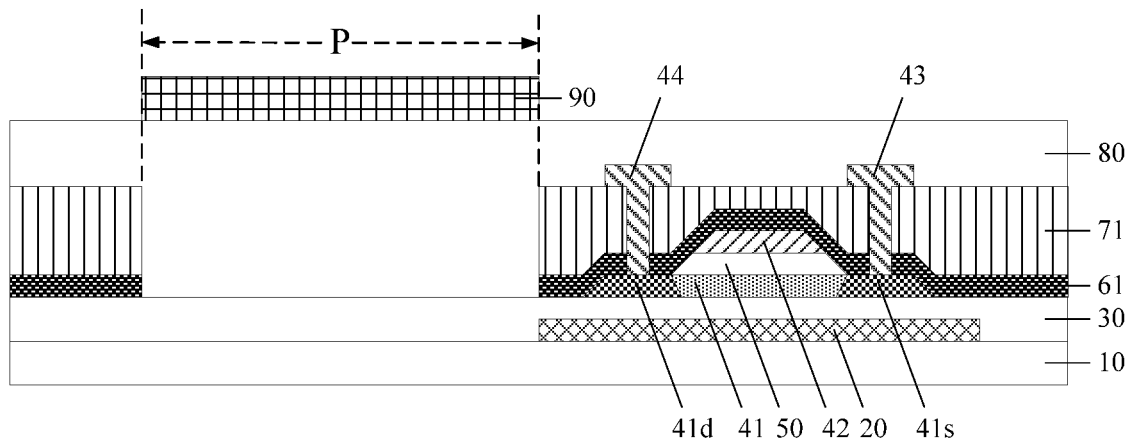
FIG. 9 is a schematic diagram 7 of structures formed by the method for manufacturing the array substrate provided by an embodiment of the present disclosure.

S06: as shown in FIG. 9, forming a color filter (CF) layer 90 on parts of the passivation layer 80 covering the hollowed-out areas.

Herein, the passivation layer 80 covers the film layers on the base substrate 10, namely covering the first ILD 61 and regions of the buffer layer 30 exposed by the first ILD 61 and the second ILD 71 together, so as to provide a relatively flat base for the subsequent process.

Embodiments of the present disclosure also provide an array substrate. As illustrated in FIG. 6, the array substrate comprises a base substrate 10 and a light-shielding pattern layer 20, a buffer layer 30, an active layer 41, a gate insulating layer 50 and a gate electrode 42, which are away from the base substrate 10 in sequence; a first ILD 61 disposed above the active layer 41, the first ILD 61 being made from opaque insulating a-Si material and provided with through holes 410 through which a source contact region 41s and a drain contact region 41d of the active layer 41 are exposed; and a source electrode 43 and a drain electrode 44 disposed on the first ILD 61 and respectively connected with the source contact region 41s and the drain contact region 41d via the through holes 410.

As shown in FIG. 6, the first ILD 61 also directly contacts side surfaces of the active layer 41, that is, the first ILD 61 covers the part on the active layer 41 and the side surfaces of the active layer 41 relative to the base substrate 10.

In this way, the basic encircling of the upper, the lower, the left and the right of the active layer 41 is realized by the first ILD 61 of opaque insulating a-Si and the underlying light-shielding pattern layer 20, so as to effectively avoid the reliability of the active layer 41 from being affected by illumination.

In this way, the active layer can be protected from being affected by illumination, the $V_{th}$ drift phenomenon of the TFTs is reduced, and good switching performances of the device can be obtained.

To reduce the parasitic resistance of the device, the material of the gate electrode 42 includes Cu. For instance, it may be prepared by Cu metal or an alloy containing the Cu metal. Moreover, the first ILD 61 made from the a-Si material(s) directly contact(s) the gate electrode 42 and the active layer 41, namely the first ILD 61 directly covers the gate electrode 42 and the active layer 41.

In this way, as the first ILD 61 is made from opaque insulating a-Si material(s), no oxygen element is introduced, so the Cu oxidation problem caused by using insulating materials, such as silicon oxide, or aluminum oxide, to prepare the ILD, can be avoided.

The active layer 41 is oxide semiconductor material (e.g., IGZO) having high migration rate and good uniformity and being able to be prepared under a low-temperature process. Both the source contact region 41s and the drain contact region 41d of the active layer 41 of the oxide semiconductor material are conductive regions formed by a doping process. The first ILD 61 directly contacts the gate electrode 42 and the active layer 41.

As the first ILD 61 made from the a-Si material is formed above the active layer 41 of the oxide semiconductor material, Si atoms may be bound with oxygen on a surface of the oxide semiconductor to generate a variety of forms of $SiO_x$ with variable stoichiometric proportion, so that the number of oxygen vacancies in the conductive regions, namely the source contact region 41s and the drain contact region 41d, of the active layer 41, can be increased, and the conduction effect of the source contact region 41s and the drain contact region 41d can be further enhanced, which can reduce the contact resistance obtained after the source electrode and the drain electrode are respectively connected with the source contact region 41s and the drain contact region 41d of the active layer 41, and the resistance of a lightly doped drain (LDD) region (referring to an LDD region in a channel, arranged near the drain electrode).

As shown in FIG. 6, the array substrate may further comprise: a second ILD 71 disposed on the first ILD 61 and having a same pattern as the first ILD 61. The through holes 410, through which the source contact region 41s and the drain contact region 41d of the active layer 41 are exposed, run through the first ILD 61 and the second ILD 71.

The second ILD 71 may be made from transparent insulating material(s), such as $SiO_x$, $SiN_x$ and $Al_2O_3$, but the embodiment of the present disclosure is not limited thereto. In this way, a flat base with a certain thickness is provided for the subsequent process, and the parasitic capacitance of the device is reduced.

When the array substrate is, for instance, applied in an LCD device comprising a backlight or a bottom-emission/double-sided emission type OLED display device, as the first ILD 61 is made from opaque insulating a-Si material(s), to permit an effective luminous efficiency of the array substrate, as shown in FIG. 6, the array substrate includes a plurality of pixel regions (refer to numeral P in the figures); and the first ILD 61 is also provided with a hollowed-out part in each of the pixel regions.

As shown in FIG. 9, the array substrate further comprises: a passivation layer (PVX) 80 covering the base substrate 10 and a color filter (CF) layer 90 disposed on parts of the passivation layer 80 covering the hollowed-out areas.

The embodiments of the present disclosure also provide a display device, which comprises any of said array substrates. The display device may be, for instance, any product or component with display function, such as an LCD panel, an LCD, an LCD TV, an OLED display panel, an OLED display, an OLED TV, e-paper or a digital picture frame.

The described above are only exemplary embodiments of the present disclosure, and the present disclosure is not intended to be limited thereto. For one skilled in the art, various changes and alternations may be readily contemplated without departing from the technical scope of the present disclosure, and all of these changes and alternations shall fall within the scope of the present disclosure.

What is claimed is:

1. A method for manufacturing an array substrate, comprising:
   forming a light-shielding pattern layer, a buffer layer, an active layer, a gate insulating layer and a gate electrode on a base substrate, which are away from the base substrate in sequence;
   forming an amorphous silicon (a-Si) film on the base substrate in a temperature range of 15-150° C.;

forming a first interlayer dielectric (ILD) at least disposed above the active layer by patterning the a-Si film;
forming through holes in the first ILD, through which a source contact region and a drain contact region of the active layer are exposed; and
forming a source electrode and a drain electrode on the first ILD, which are respectively connected with the source contact region and the drain contact region via the through holes.

2. The manufacturing method according to claim 1, wherein the a-Si film is deposited and formed on the base substrate by using silicon (Si) as a target material via a sputtering process in a vacuum or an inert gas environment; or the a-Si film is deposited and formed on the base substrate by using Si as an evaporation source via a vapor depositing process in a vacuum or an inert gas environment.

3. The manufacturing method according to claim 2, further comprising:
before forming the first interlayer insulating film by patterning the a-Si film,
forming an insulating material film covering the a-Si film; and
forming a first ILD and a second ILD with a same pattern, which are at least disposed above the active layer, by patterning the a-Si film and the insulating material film through a same patterning process, in which the through holes, through which the source contact region and the drain contact region of the active layer are exposed, run through the first ILD and the second ILD.

4. The manufacturing method according to claim 3, wherein the array substrate comprises a plurality of pixel regions; and the manufacturing method further comprises:
forming a hollowed-out part in each of the pixel regions, in the first ILD while forming the through holes in the first ILD, through which the source contact region and the drain contact region on the active layer are exposed.

5. The manufacturing method according to claim 1, further comprising:
before forming the first interlayer insulating film by patterning the a-Si film,
forming an insulating material film covering the a-Si film; and
forming a first ILD and a second ILD with a same pattern, which are at least disposed above the active layer, by patterning the a-Si film and the insulating material film through a same patterning process, in which the through holes, through Which the source contact region and the drain contact region of the active layer are exposed, run through the first ILD and the second ILD.

6. The manufacturing method according to claim 1, wherein the array substrate comprises a plurality of pixel regions; and the manufacturing method further comprises:
forming a hollowed-out part in each of the pixel regions, in the first ILD while forming the through holes in the first ILD, through which the source contact region and the drain contact region on the active layer are exposed.

7. The manufacturing method according to claim 6, further comprising:
forming the source electrode and the drain electrode on the ILD(s) and respectively connected with the source contact region and the drain contact region via the through holes;
forming a passivation layer covering the base substrate; and
forming a color filter (CF) layer on a part of the passivation layer covering the hollowed-out regions.

8. The manufacturing method according to claim 1, wherein
material of the gate electrode comprises copper (Cu); and
the first ILD directly contacts the gate electrode and the active layer.

9. The manufacturing method according to claim 1, wherein
the active layer is an oxide semiconductor active layer, and both the source contact region and the drain contact region of the active layer are conductive regions formed by a doping process; and
the first ILD directly contacts the gate electrode and the active layer.

10. The manufacturing method according to claim 1, wherein the first ILD contacts side surfaces of the active layer.

11. An array substrate, comprising:
a base substrate;
a light-shielding patter layer, a buffer layer, an active layer, a gate insulating layer, and a gate electrode, which are away from the base substrate in sequence;
a first interlayer dielectric (ILD) disposed above the active layer, the first ILD being made from opaque insulating a-Si material and provided with through holes through which a source contact region and a drain contact region of the active layer are exposed;
a source electrode and a drain electrode on the first ILD, which are respectively connected with the source contact region and the drain contact region via the through holes; and
a plurality of pixel regions, wherein the first ILD further comprises a hollowed-out part disposed in each of the pixel regions.

12. The array substrate according to claim 11, further comprising:
a second ILD disposed on the first ILD and having a same pattern as that of the first ILD, wherein the through holes, through which the source contact region and the drain contact region of the active layer are exposed, run through the first ILD and the second ILD.

13. The array substrate according to claim 12, further comprising:
a passivation layer covering the base substrate; and
a color filter layer disposed on parts of the passivation layer covering the hollowed-out regions.

14. The array substrate according to claim 11, further comprising:
a passivation layer covering the base substrate; and
a color filter layer disposed on parts of the passivation layer covering the hollowed-out regions.

15. The array substrate according to claim 11, wherein
material of the gate electrode comprises Cu; and the first ILD directly contacts the gate electrode and the active layer.

16. The array substrate according to claim 11, wherein the active layer is an oxide semiconductor layer, and both the source contact region and the drain contact region of the active layer are doped conductive areas; and the first ILD directly contacts the gate electrode and the active layer.

17. The array substrate according to claim 11, wherein the first ILD also contacts side surfaces of the active layer.

18. A display device, comprising an array substrate, wherein the array substrate comprises:
a base substrate;
a light-shielding pattern layer, a buffer layer, an active layer, a gate insulating layer, and a gate electrode, which are away from the base substrate in sequence;

a first interlayer dielectric (ILD) disposed above the active layer, the first ILD being made from opaque insulating a-Si material and provided with through holes through which a source contact region and a drain contact region of the active layer are exposed;

a source electrode and a drain electrode on the first ILD, which are respectively connected with the source contact region and the drain contact region via the through holes; and a plurality of pixel regions, wherein the first ILD further comprises a hollowed-out part disposed in each of the pixel regions.

* * * * *